US006207302B1

(12) United States Patent
Sugiura et al.

(10) Patent No.: US 6,207,302 B1
(45) Date of Patent: Mar. 27, 2001

(54) ELECTROLUMINESCENT DEVICE AND METHOD OF PRODUCING THE SAME

(75) Inventors: Kazuhiko Sugiura, Nagoya; Masayuki Katayama, Handa; Nobuei Ito, Chiryu, all of (JP)

(73) Assignee: DENSO Corporation, Kariya (JP)

( * ) Notice: Subject to any disclaimer, the term of this patent is extended or adjusted under 35 U.S.C. 154(b) by 0 days.

(21) Appl. No.: 09/034,165

(22) Filed: Mar. 2, 1998

(30) Foreign Application Priority Data

Mar. 4, 1997 (JP) .................................................. 9-049178
Dec. 11, 1997 (JP) .................................................. 9-341462

(51) Int. Cl.⁷ ............................. H05B 33/22; C23C 16/40
(52) U.S. Cl. ..................... 428/690; 428/917; 428/701; 428/702; 428/212; 313/509; 427/66; 427/70; 427/255.31; 427/255.32; 427/255.36; 427/255.7
(58) Field of Search ..................................... 428/690, 691, 428/917, 212, 701, 702; 313/504, 517, 509; 427/66, 69, 70, 255.23, 255.31, 255.32, 255.36, 255.7

(56) References Cited

U.S. PATENT DOCUMENTS 3,811,938 * 5/1974 Hirose et al. .
4,058,430 11/1977 Suntola et al. ........................ 156/611
4,413,022 11/1983 Suntola et al. ..................... 427/255.2
4,486,487 12/1984 Skarp .................................... 428/216
4,547,703 10/1985 Fujita et al. .......................... 313/509
4,603,280 * 7/1986 Pankove .............................. 313/509
5,200,277 * 4/1993 Nakayama et al. .................. 428/690
5,955,835 * 9/1999 Oh et al. .............................. 313/503
5,958,610 * 9/1999 Yonekawa et al. .................. 428/690

FOREIGN PATENT DOCUMENTS 0 637 087 A1 * 2/1995 (EP) .
59-47879 11/1984 (JP) .
1-18563 4/1989 (JP) .

* cited by examiner

Primary Examiner—Marie Yamnitzky
(74) Attorney, Agent, or Firm—Pillsbury Winthrop LLP

(57) ABSTRACT

First and second insulating layers in an EL device are respectively composed of $Al_2O_3$/TiOx:Ba laminated layers. The $Al_2O_3$/TiOx:Ba laminated layers are formed by alternately laminating $Al_2O_3$ layers and $TiO_2$ layers added with Ba by an ALE method. Adding Ba into the $TiO_2$ layers mitigates a change in resistivity thereof with respect to a change in temperature. As a result, the EL device provides an excellent voltage withstanding performance which is stable against the changes in the temperature.

24 Claims, 3 Drawing Sheets

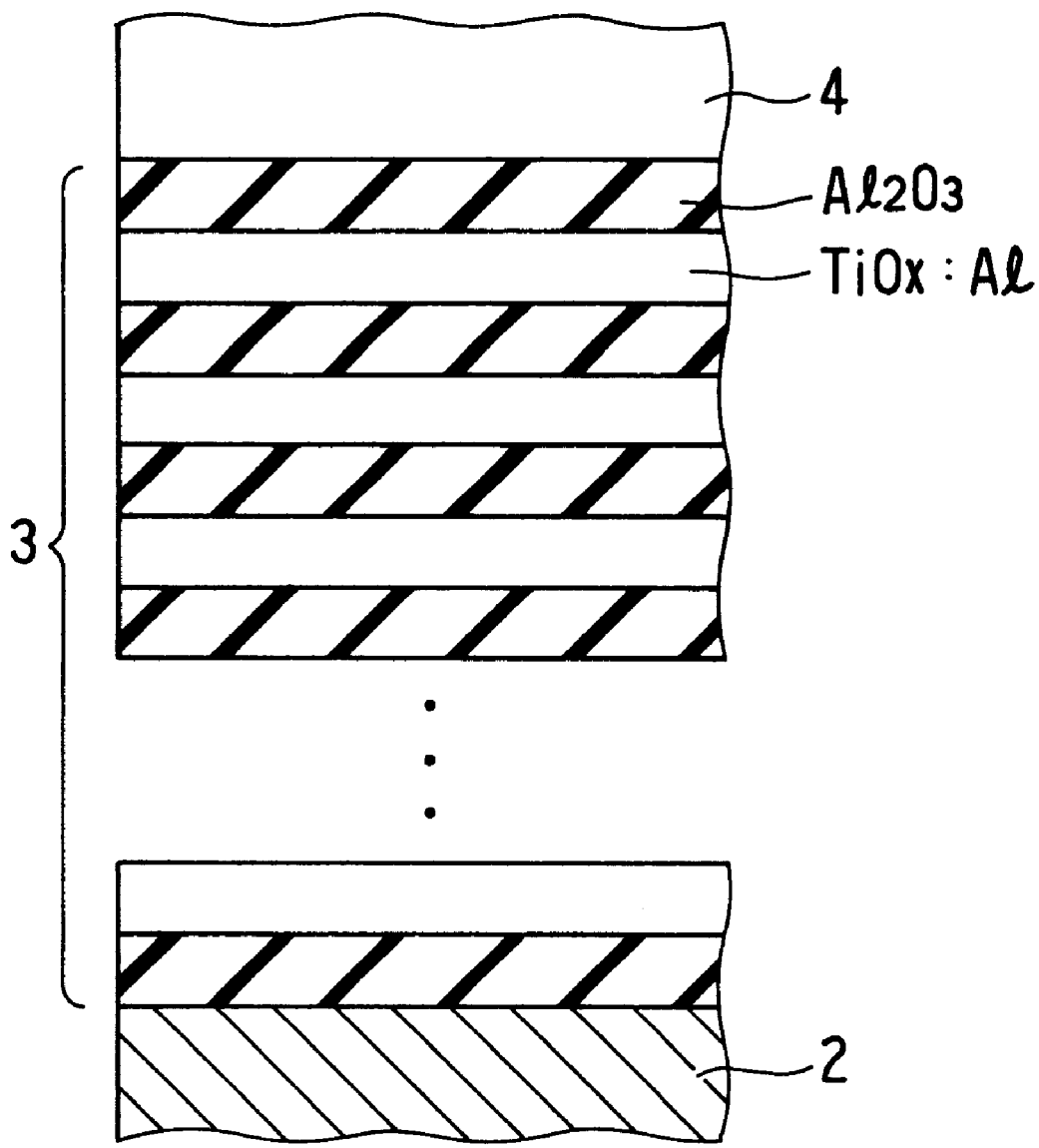

ELECTROLUMINESCENT DEVICE AND METHOD OF PRODUCING THE SAME

CROSS REFERENCE TO RELATED APPLICATIONS

This application is based upon and claims the benefit of priority of the prior Japanese Patent Applications No. 9-49178 filed on Mar. 4, 1997, and No. 9-341462 filed on Dec. 11, 1997, the contents of which are incorporated herein by reference.

BACKGROUND OF THE INVENTION

1. Field of the Invention

The present invention relates to electroluminescent (hereinbelow referred to as EL) devices that are used for various instruments of emissive-type segment displays and matrix displays, displays of various information terminals, and the like. The present invention also relates to methods for producing the same.

2. Related Arts

An EL device is typically formed by laminating a first electrode, a first insulating layer, a luminescent layer, a second insulating layer, and a second electrode on an insulating glass substrate in this order. The first and second insulating layers are made of silicon dioxide ($SiO_2$), silicon nitride (SiN), silicon oxynitride (SiON), ditantalum pentaoxide ($Ta_2O_5$) or the like, and formed by a sputtering method, a vapor deposition method, or the like.

Further, JP-B2-64-5440 proposes an insulating layer having an aluminum oxide ($Al_2O_3$)/titanium oxide ($TiO_2$) laminated structure (herebelow referred to as $Al_2O_3/TiO_2$ laminated layer) to improve a withstand voltage of an EL device. The $Al_2O_3/TiO_2$ laminated layer is formed by alternately laminating $Al_2O_3$ layers and $TiO_2$ layers by an Atomic Layer Epitaxy (ALE) method.

Each of the $Al_2O_3$ layers has insulating characteristics and each of the $TiO_2$ layers has conductive characteristics. Accordingly, the $Al_2O_3/TiO_2$ laminated layer withstands a high voltage. However, $TiO_2$ forming the $TiO_2$ layers is very sensitive to a temperature, and a resistivity of $TiO_2$ decreases enormously as the temperature rises. When the resistivity of $TiO_2$ decreases, each resistance of the $TiO_2$ layers in the $Al_2O_3/TiO_2$ laminated layer also decreases. This results in substantial deterioration of the voltage withstanding performance of the $Al_2O_3/TiO_2$ laminated layer.

SUMMARY OF THE INVENTION

The present invention has been made in view of the above-mentioned problem and an object of the present invention is to provide an EL device having a high withstand voltage stable against a change in temperature and a method of producing the same. More specifically, the object of the present invention is to provide an insulating layer with a laminated structure for an EL device having a withstand voltage stable against a change in temperature and a method of producing the same.

To achieve the above-mentioned object, an EL device according to the present invention includes an insulating layer having a laminated structure of first and second layers. The first layer includes an insulating material, and the second layer includes titanium oxide added with an element for mitigating a change in resistivity of the insulating layer relative to a change in temperature. Accordingly, the EL device has a high withstand voltage stable against the change in the temperature. Preferably, an atomic ratio of the element relative to the titanium in the second layer is in a range of 0.01 to 1. The element can be selected from a group consisting of calcium, barium, strontium, aluminum, lead, and magnesium. More preferably, the insulating material of the first layer has a resistivity larger than $1 \times 10^{10}$ Ωcm.

The second layer may include a titanium oxide type material having a positive temperature coefficient of resistivity. In this case, the EL device has a high withstand voltage stable against the change in the temperature as well. The titanium oxide type material can be selected from calcium titanate, barium titanate, and strontium titanate.

The insulating layer of the present invention can be produced by alternatively laminating the first and second layers by the ALE method.

BRIEF DESCRIPTION OF THE DRAWINGS

These and other objects and features of the present invention will become more readily apparent from a better understanding of preferred embodiments described below with reference to the following drawings, in which:

FIG. 5 is a partially enlarged cross-sectional view of the EL device of FIG. 1, in which $Al_2O_3$/TiOx:Al laminated layers are employed as first and second insulating layers as a modified example of the first embodiment.

DETAILED DESCRIPTION OF THE PREFERRED EMBODIMENTS (First Embodiment)

Figure 1:
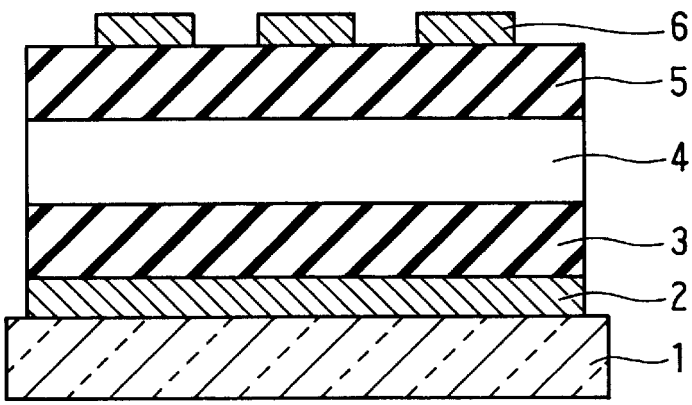
FIG. 1 is a cross-sectional view of an EL device according to a first embodiment of the present invention.

Referring to FIG. 1, an EL device in a first preferred embodiment is composed of an insulating glass substrate 1, and a first electrode 2, a first insulating layer 3, a luminescent layer 4, a second insulating layer 5 and a second electrode 6, which are laminated on the insulating glass substrate 1 in this order. In the EL device, at least the first electrode 2 and the first insulation layer 3, or the second insulating layer 5 and the second electrode 6, which are disposed on a light emitting side of the luminescent layer 4, are made of transparent materials. All of the first and second electrodes 2 and 6 and the first and second insulating layers 3 and 5, which are provided on the both sides of the luminescent layer 4, may be made of transparent materials. In this case, light is taken out from the both sides of the luminescent layer 4.

The first and second insulating layers 3 and 5 are respectively formed by alternately laminating $Al_2O_3$ layers (first layers) and $TiO_2$ layers added with barium (Ba) (second layers). The $TiO_2$ layers added with Ba are referred to as TiOx:Ba layers, and the laminated layer of the $Al_2O_3$ layers and the TiOx:Ba layers are referred to as an $Al_2O_3$/TiOx:Ba laminated layer. In the TiOx:Ba layers, because barium titanate ($BaTiO_3$) is produced from added Ba and $TiO_2$, a stoichiometric ratio of titanium (Ti) to oxygen (O) decreases slightly from 2. Therefore, the subscript x of TiOx is slightly smaller than 2 and varies depending on formation conditions of the TiOx:Ba layers.

Figure 2:
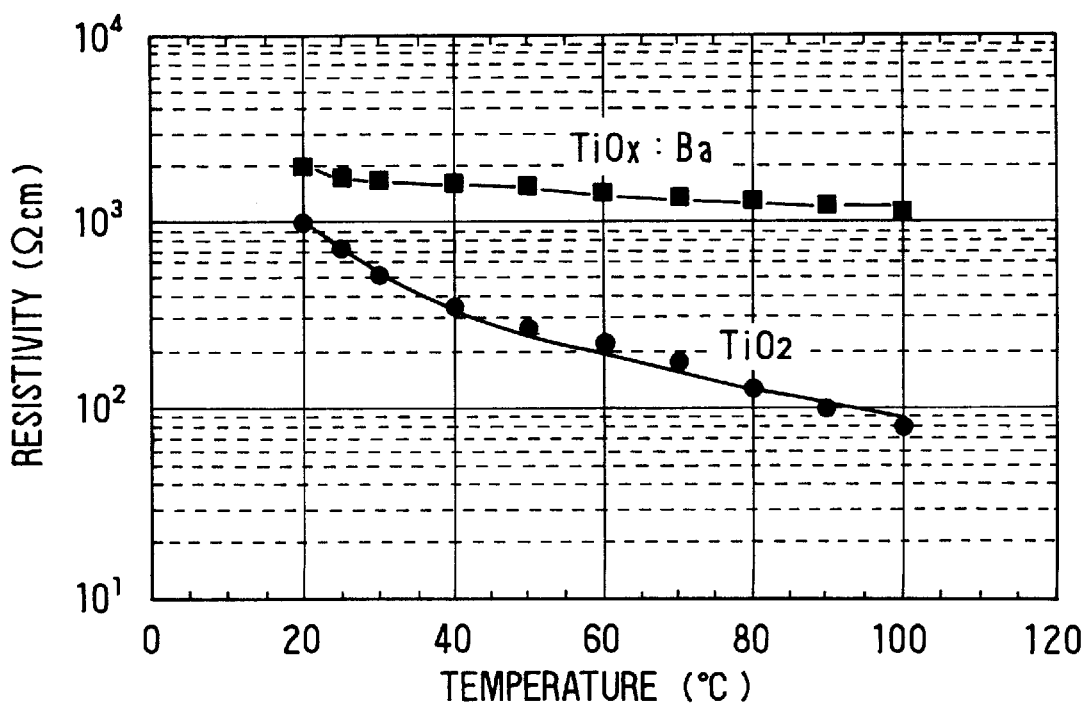
FIG. 2 is a graph illustrating resistivity versus temperature characteristics of a $TiO_2$ layer added with barium (TiOx:Ba) and a $TiO_2$ layer with a desired thickness.

Next, resistivity versus temperature characteristics of one of the TiOx:Ba layers will be explained compared to a $TiO_2$ layer without including Ba. The TiOx:Ba layer and the $TiO_2$ layer used in this explanation have a specific thickness respectively. Referring to FIG. 2, the resistivity of the $TiO_2$ layer decreases as the temperature rises. For example, when the temperature rises from a room temperature (25° C.) to 80° C., the resistivity of the $TiO_2$ layer decreases to approximately one tenth of the original resistivity. As opposed to this, a change in resistivity of the TiOx:Ba layer is small compared to that of the $TiO_2$ layer. Accordingly, it is confirmed that adding Ba to the $TiO_2$ layer mitigates the change in the resistivity of the $TiO_2$ layer with respect to the change in the temperature.

Next, characteristics of a breakdown voltage with respect to a temperature of the EL device in this embodiment were measured compared to an EL device including $Al_2O_3/TiO_2$ laminated layers as first and second insulating layers 3 and 5. As mentioned above, the EL device in this embodiment includes the $Al_2O_3$/TiOx:Ba laminated layers as the first and second insulating layers 3 and 5. The breakdown voltage is a voltage applied to the EL device when breakdown occurs. Each of the $Al_2O_3$/TiOx:Ba laminated layer and the $Al_2O_3$/$TiO_2$ laminated layer includes each 30 layers of $Al_2O_3$ and TiOx:Ba ($TiO_2$) with a thickness of 5 nm.

Figure 3:
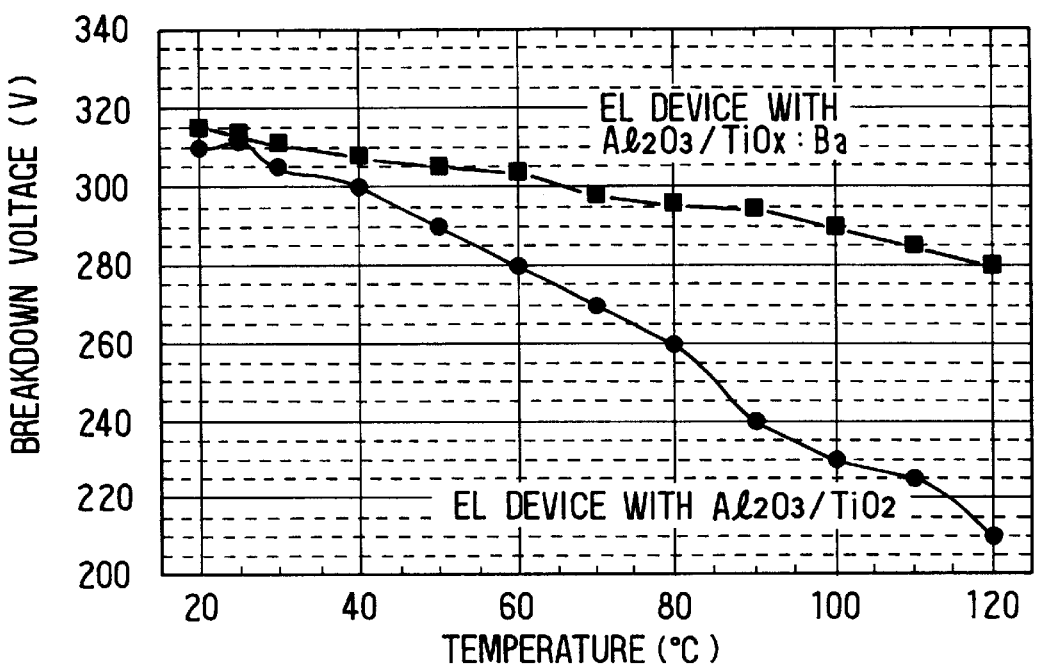
FIG. 3 is a graph illustrating breakdown voltage versus temperature characteristics of the EL device including an $Al_2O_3$/TiOx:Ba laminated layer in the first embodiment and of an EL device including an $Al_2O_3/TiO_2$ laminated layer as a comparative example.

As shown in FIG. 3, the change in the breakdown voltage to the change in the temperature of the EL device with the $Al_2O_3$/TiOx:Ba laminated layer is less than that of the EL device with the $Al_2O_3$/$TiO_2$ laminated layer. In other words, a voltage withstanding performance of the EL device with the $Al_2O_3$/TiOx:Ba laminated layer is stable against the change in the temperature. Therefore, the EL device with the $Al_2O_3$/TiOx:Ba laminated layer can provide an excellent voltage withstanding performance even when the EL device generates heat due to light emission therefrom, resulting in high reliability.

Next, a method of producing the EL device will be described with reference to FIG. 1. First, the first electrode 2 made of transparent indium tin oxide (ITO) is deposited on the glass substrate 1 by a sputtering method. Next, the first insulating layer 3 composed of the $Al_2O_3$/TiOx:Ba laminated layer is formed on the first electrode 2 by alternately laminating $Al_2O_3$ layers and the TiOx:Ba layers by the ALE method.

In detail, as a first step, an $Al_2O_3$ layer is formed on the first electrode 2 by the ALE method using aluminum trichloride ($AlCl_3$) gas and water vapor ($H_2O$). The $AlCl_3$ gas and the water vapor serve as source gases for aluminum (Al) and oxygen (O) respectively. The source gases are introduced into a forming chamber alternately so that only one atomic layer is formed at a time. That is, the $AlCl_3$ gas is introduced into the forming chamber with argon (Ar) carrier gas for one second, and then the chamber is purged so that the $AlCl_3$ gas in the chamber is sufficiently ventilated. Next, water vapor is introduced into the chamber with the Ar carrier gas for one second, and then the chamber is purged so that the water vapor in the chamber is sufficiently ventilated. The $Al_2O_3$ layer with a desired thickness is formed by repeating the above-mentioned introducing and purging cycle.

Next, as a second step, an $TiO_2$ layer is formed on the $Al_2O_3$ layer using titanium tetrachloride ($TiCl_4$) gas and water vapor. The $TiCl_4$ gas and the water vapor serve as source gases for titan (Ti) and O respectively. As in the first step, first, the $TiCl_4$ gas is introduced into the forming chamber with the Ar carrier gas for one second, and then the chamber is purged so that the $TiCl_4$ gas in the chamber is sufficiently ventilated. Next, the water vapor is introduced into the chamber with the Ar carrier gas for one second, and then the chamber is purged so that the $H_2O$ gas in the chamber is sufficiently ventilated. The $TiO_2$ layer with a desired thickness is formed by repeating the above-mentioned introducing and purging cycle as well.

When forming the $TiO_2$ layer, it is noted that Ba is added to the $TiO_2$ layer so that the resistivity of the $TiO_2$ layer becomes stable against the change in the temperature. To add Ba to the $TiO_2$ layer, a bisdipivaloymethanate barium ($Ba(C_{11}H_{19}O_2)_2$) gas, which is a source gas for Ba, is introduced into the forming chamber with the Ar carrier gas immediately before introducing the $TiCl_4$ gas. The amount of Ba to be added is controlled by adjusting an introducing time of the $Ba(C_{11}H_{19}O_2)_2$ gas or by controlling the number of times of introducing the $Ba(C_{11}H_{19}O_2)_2$ gas relative to that of introducing the $TiCl_4$ gas.

As another method of adding Ba to the $TiO_2$ layer, the $Ba(C_{11}H_{19}O_2)_2$ gas and the $TiCl_4$ gas may be introduced into the chamber simultaneously. In this method, the amount of Ba to be added is controlled by setting temperatures of the both source gases based on an introduction ratio therebetween. The amount of Ba to be added can be also controlled by controlling a flow rate of the Ar carrier gas.

The $Al_2O_3$/TiOx:Ba laminated layer as the first insulating layer 3 with a desired thickness is formed by repeating the above-described first and second steps for an appropriate times. In this first embodiment, the $Al_2O_3$ and TiOx:Ba layers are alternately laminated with each other to respectively have 30 layers, thereby forming the $Al_2O_3$/TiOx:Ba laminated layer. Each thickness of the $Al_2O_3$ and TiOx:Ba layers is preferably 5 nm. Although the top and bottom layers of the $Al_2O_3$/TiOx:Ba laminated layer may be either the $Al_2O_3$ layer or the TiOx:Ba layer, it is more preferable that each of the top and bottom layers is the TiOx:Ba layer.

Next, the luminescent layer 4 made of zinc sulfide (ZnS) as a host material added with manganese (Mn) as a luminescent center (ZnS:Mn) is deposited on the insulating layer 3 by the vapor deposition method. Further, the second insulating layer 5 is formed on the luminescent layer 4 in the same way as the first insulating layer 3. The second electrode 6 made of ITO is formed on the second insulating layer 5 in the same way as the first electrode 2. The luminescent layer 4 may be deposited by the ALE method. In this case, the first insulating layer 3, the luminescent layer 4 and the second insulating layer 5 are formed successively. Thus, the EL device shown in FIG. 2 is manufactured.

When alternatively depositing the $Al_2O_3$ layers and the TiOx:Ba layers by the ALE method to form the insulating layers 3 and 5, the $Al_2O_3$ layers having a thickness less than 0.5 nm do not work as insulating layers. Further, the $Al_2O_3$ layers and the TiOx:Ba layers respectively having a thickness more than 100 nm decrease the withstand voltage of the EL device. Therefore, the thickness of the $Al_2O_3$ layers and the TiOx:Ba layers is preferably between 0.5 nm and 100 nm, and more preferably between 1 nm and 10 nm.

When the amounts of Ba included in the TiOx:Ba layers are insufficient, the stability of the resistivity of the $Al_2O_3$/TiOx:Ba laminated layer against the change in the temperature deteriorates. Therefore, an atomic ratio of Ba to Ti in the TiOx:Ba layers should be 0.01 or more. When the atomic ratio of Ba to Ti is larger than 1 that is a stoichiometric ratio of BaTiO3, water-soluble barium oxide (BaO) is generated due to an excessive amount of Ba. As a result, the $Al_2O_3$/TiOx:Ba laminated layer can not sufficiently work as an insulating layer. Therefore, the atomic ratio of Ba to Ti in the TiOx:Ba layer should be 1 or less. In addition to Ba, other elements such as calcium (Ca), strontium (Sr), Al, lead (Pb) and magnesium (Mg) can be used as an additive for the $TiO_2$ layers.

Each of the $Al_2O_3$ layers provides an excellent insulating performance even with a thickness of a few nm. However, other insulating materials such as magnesium oxide (MgO) and silicon oxide ($SiO_2$) may be used in place of the $Al_2O_3$, provided that the materials have a resistivity larger than $10^{10}$ $\Omega$cm and can be formed into an extremely thin layer by the ALE method.

The above-mentioned various materials and elements can be combined as the insulating material for the first layer and the additives for the second layer for the first and second insulating layers 3 and 5. For example, an $Al_2O_3$ layer and a $TiO_2$ layer added with Al (TiOx:Al layer) may be employed as the first and second layers respectively. Then, a method of forming a laminated layer composed of alternatively laminating $Al_2O_3$ and TiOx:Al layers (i.e., an $Al_2O_3$/TixO:Al layer), which is applicable for the first and second insulating layers 3 and 5, will be described below.

First, as a first step, the $Al_2O_3$ layer is formed by the ALE method using the $AlCl_3$ gas and water vapor as the source gases for Al and O respectively in substantially the same procedures as mentioned above. Next, as a second step, the $TiO_2$ layer is formed on the $Al_2O_3$ layer, using the $TiCl_4$ gas and water vapor as the source gases for Ti and O respectively in substantially the same procedures as mentioned above. At that time, Al is added to the $TiO_2$ layer so that the resistivity of the $TiO_2$ layer becomes stable against the change in the temperature. As a method of adding Al to the $TiO_2$ layer, the $AlCl_3$ gas is introduced into the forming chamber immediately before introducing the $TiCl_4$ gas. An amount of Al to be added is controlled according to the introducing time of the $AlCl_3$ gas or the number of times of introducing the $AlCl_3$ gas relative to that of introducing the $TiCl_4$ gas. Thus, when Al is used as the additive for the $TiO_2$ layer, the $AlCl_4$ gas is used not only for forming the $Al_2O_3$ layer but also for adding Al to the $TiO_2$ layer. This reduces production cost composed of material cost, equipment cost and the like. By repeating the $Al_2O_3$/TiOx:Al laminated layer is obtained.

In this embodiment, employed $Al_2O_3$/TiOx:Al laminated layers as the first and second insulating layers 3 and 5 respectively include 121 layers of $Al_2O_3$ with a thickness of 2 nm and 120 layers of TiOx:Al with a thickness of 2.5 nm. The bottom layer in contact with the first electrode 2 and the top layer in contact with the luminescent layer 4 are the $Al_2O_3$ layers (see FIG. 5).

Employing the $Al_2O_3$ layer as the top and bottom layers of the first insulating layer 3 prevents invasion of elements, which can deteriorate the withstand voltage of the EL device. The elements include heavy metals such as alkaline earth metals, alkaline metals, iron, and the like, which are contained in source materials for the first electrode 2 and the luminescent layer 4 (e.g., a pellet of ZnS, a source material of ITO). The reason that the $Al_2O_3$ layers prevent the invasion of the elements is because the $Al_2O_3$ layers are insulative. As a result, deterioration of the withstand voltage of the insulating layer 3 is prevented. The top and bottom layers of the second insulating layer 5 are also the $Al_2O_3$ layers for the same reason.

If the TiOx:Al layers are employed as the top and bottom layers of the first insulating layer 3, the above-mentioned elements easily diffuse into the TiOx:Al layers to decrease the withstand voltage of the first insulating layer 3. This is because the TiOx:Al layers have electrical conductivity and are likely to have oxygen vacancies therein. Specifically, when the EL device is activated, the above-mentioned elements diffuse under an electric field. The ions of the above-mentioned elements easily diffuse into the TiOx:Al layers due to conductivity of the TiOx:Al layers. Further, it is considered that ion paths are easily provided in the TiOx:Al layers due to the oxygen vacancies to increase diffusion speeds of the ions.

The first layers for the first and second insulating layer 3 and 5 can be made of other insulating materials such as MgO or $SiO_2$ instead of $Al_2O_3$. In these cases, MgO or $SiO_2$ layers are used for the top and bottom layers of the first and second insulating layers 3 and 5 to prevent deterioration of the voltage withstanding performance of the insulating layers 3 and 5.

(Second Embodiment)

In a second preferred embodiment, $Al_2O_3$/strontium titanate ($SrTiO_3$) laminated layers are employed as the first and second insulating layers 3 and 5. The other features are the same as those in the first embodiment, and detail descriptions thereof will not be reiterated.

The first and second insulating layers 3 and 5 in the second embodiment are formed in the following way. First, as a first step, an $Al_2O_3$ layer is formed as a first layer by the ALE method in the same procedures as the first embodiment. Next, as a second step, a $SrTiO_3$ layer is formed on the $Al_2O_3$ layer as a second layer, using $TiCl_4$ gas, bisdipivaloymethanate strontium ($Sr(C_{11}H_{19}O_2)_2$) gas and water vapor as source gases for Ti, Sr and O respectively.

The second step for forming the $SrTiO_3$ layer will be described in more detail. First, the $TiCl_4$ gas is introduced into a forming chamber with an Ar carrier gas for one second, and then the chamber is purged so that the $TiCl_4$ gas in the chamber is ventilated sufficiently. Next, the water vapor is introduced into the forming chamber with the Ar carrier gas for one second, and then the chamber is purged so that the water vapor in the chamber is ventilated sufficiently. Thereafter, the $Sr(C_{11}H_{19}O_2)_2$ gas is introduced into the forming chamber with the Ar carrier gas for one second, and then the chamber is purged so that the $Sr(C_{11}H_{19}O_2)_2$ gas in the chamber is ventilated sufficiently. Further, the water vapor is introduced into the chamber with the Ar carrier gas for one second, and then the chamber is purged so that the water vapor in the chamber is ventilated sufficiently. By repeating the above-mentioned introducing and purging cycle for an appropriate number of times, the $SrTiO_3$ layer with a desired thickness is formed.

The $Al_2O_3$/$SrTiO_3$ laminated layer with a desired thickness is formed by repeating the above-mentioned first and second steps for an appropriate number of times to function as the first or second insulating layer 3 or 5. The top and bottom layers of the first and second insulation layers 3 and 5 may be either the $Al_2O_3$ layers or the $SrTiO_3$ layers.

Figure 4:
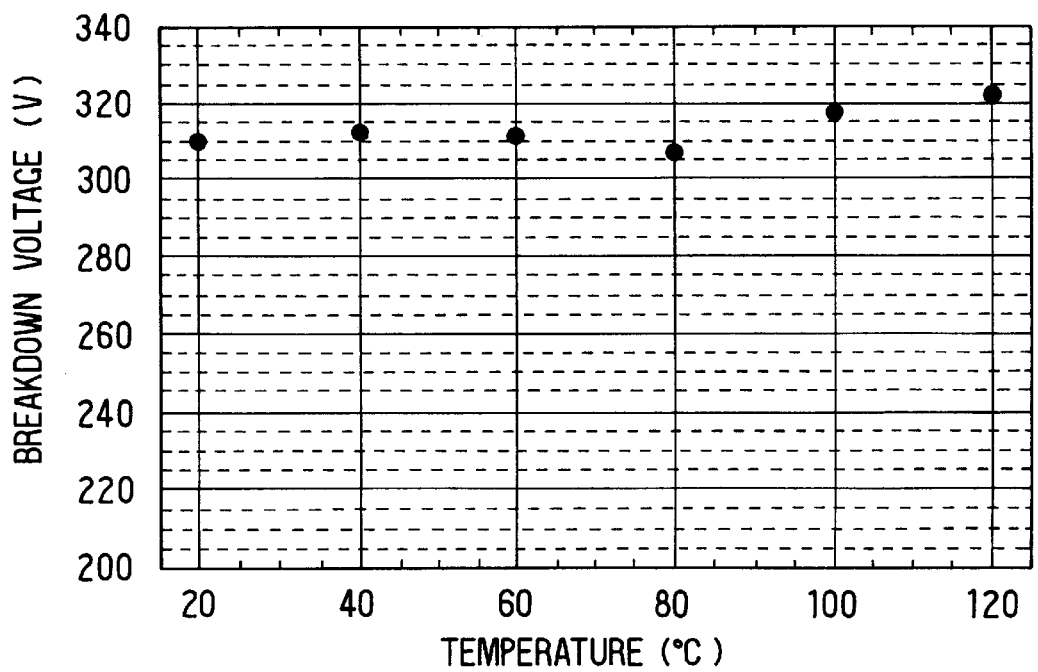
FIG. 4 is a graph illustrating breakdown voltage versus temperature characteristics of an EL device including an $Al_2O_3$/strontium titanate ($SrTiO_3$) laminated layer in a second embodiment.

Characteristics of the above-mentioned $Al_2O_3$/$SrTiO_3$ laminated layer can be improved by a heat treatment for crystallizing $SrTiO_3$. This heat treatment can be conducted simultaneously with a heat treatment for the luminescent layer 4. In the thus manufactured EL device, the $SrTiO_3$ layers have a positive temperature coefficient of resistivity. That is, as the temperature rises, the resistivity of the $SrTiO_3$ layers becomes large. Therefore, the withstand voltage of the EL device hardly deteriorates with respect to the temperature as shown in FIG. 4. In this embodiment, the second layer of the first and second insulating layers 3 and 5 is made of $SrTiO_3$. However, the second layer can be made of other materials such as calcium titanate ($CaTiO_3$) and barium titanate ($BaTiO_3$) to obtain the same effects as those of SrTiO$_3$. CaTiO$_3$ and BaTiO$_3$ layers can be formed by the above-mentioned method. In this embodiment, each thickness of the first and second layers for the first and second insulating layers 3 and 5 is preferably between 0.5 nm and 100 nm as in the first embodiment.

In the first and second embodiments, sufficient insulating characteristics of the insulating layers 3 and 5 can be achieved when the numbers of the first and second layers of the insulating layers 3 and 5 are at least 10 respectively. The larger the number of the first and second layers become, the more effective the insulating characteristics of the first and second insulating layers 3 and 5 become. However, the preferable numbers of the first and second layers are respectively under 300 to prevent the EL device from being too thick.

In the first and second embodiments, the first and second electrodes 2 and 6 are made of transparent material. However, the electrode on the side opposite to the light emitting side can be made of opaque material such as metal. In this case, the light is taken out from only one side of the luminescent layer 4. The luminescent layer 4 can be made of ZnS added with terbium (Tb) or strontium sulfide (SrS) added with cerium (Ce), in addition to ZnS added with Mn. The present invention is applied not only to the EL device having the insulating layers on the both sides of the luminescent layer but also to an EL device having an insulating layer only on one side of a luminescent layer.

While the present invention has been shown and described with reference to the foregoing preferred embodiments, it will be apparent to those skilled in the art that changes in form and detail may be made therein without departing from the scope of the invention as defined in the appended claims.

What is claimed is:

1. An electroluminescent device comprising: first and second electrodes;
   a luminescent layer disposed between the first and second electrodes; and
   an insulating layer disposed between the luminescent layer and the first electrode, and having a laminated structure comprising a plurality of first layers and a plurality of second layers, the first layers being laminated alternately with the second layers, the first layers including an insulating material, the second layers including titanium dioxide and an element for mitigating a change in resistivity of the insulating layer relative to a change in temperature.

2. An electroluminescent device of claim 1, wherein an atomic ratio of the element to titanium in the second layers is in a range of 0.01 to 1.

3. An electroluminescent device of claim 1, wherein the element is selected from a group consisting of calcium, barium, strontium, aluminum, lead and magnesium.

4. An electroluminescent device of claim 1, wherein a resistivity of the insulating material of the first layers is larger than $1 \times 10^{10}$ Ωcm.

5. An electroluminescent device of claim 4, wherein the insulating material of the first layers is selected from a group consisting of aluminum oxide, magnesium oxide and silicon oxide.

6. An electroluminescent device of claim 5, wherein the insulating material of the first layers is aluminum oxide, and the element of the second layers is aluminum.

7. An electroluminescent device of claim 1, wherein one of the first layers contacts the luminescent layer and another of the first layers contacts the first electrode.

8. An electroluminescent device of claim 1, wherein each of the first layers and each of the second layers has a thickness in a range of 0.5 nm to 100 nm.

9. An electroluminescent device of claim 1, wherein the insulating layer includes 10 to 300 of the first layers and 10 to 300 of the second layers.

10. An electroluminescent device comprising:
    first and second electrodes;
    a luminescent layer disposed between the first and second electrodes; and
    an insulating layer disposed between the luminescent layer and the first electrode and having al laminated structure comprising a plurality of first layers and a plurality of second layers, the first layers being laminated alternately with the second layers, the first layers including an insulating material, the second layers being made of a material including titanium and oxygen and having a positive temperature coefficient of resistivity.

11. An electroluminescent device of claim 10, wherein the second layers include at least one material selected from a group consisting of calcium titanate, barium titanate and strontium titanate.

12. An electroluminescent device of claim 10, wherein a resistivity of the insulating material of the first layers is larger than $1 \times 10^{10}$ Ωcm.

13. An electroluminescent device of claim 12, wherein the insulating material of the first layers is selected from a group consisting of aluminum oxide, magnesium oxide and silicon oxide.

14. An electroluminescent device of claim 10, wherein one of the first layers contacts the luminescent layer and another of the first layers contacts the first electrode.

15. An electroluminescent device of claim 10, wherein each of the first layers and each of the second layers has a thickness in a range of 0.5 nm to 100 nm.

16. An electroluminescent device of claim 10, wherein the insulating layer includes 10 to 300 of the first layers and 10 to 300 of the second layers.

17. A method of forming an electroluminescent device, the method comprising:
    providing a first electrode;
    forming on the first electrode a first insulating layer comprising a plurality of first layers and a plurality of second layers, the first layers being laminated alternately with the second layers, the first and second layers each being laminated by an atomic layer epitaxy method, the first layers including an insulating material and the second layers including titanium, oxygen, and an element selected from the group consisting of calcium, barium, strontium, aluminum, lead, and magnesium;
    forming a luminescent layer on the first insulating layer;
    optionally forming a second insulating layer on the luminescent layer; and
    forming a second electrode so that the luminescent layer is interposed between the first and second electrodes.

18. A method of claim 17, wherein the insulating material of the first layers is at least one selected from a group consisting of aluminum oxide, magnesium oxide and silicon oxide.

19. A method of claim 18, wherein the insulating material of the first layers is aluminum oxide, and the element of the second layers is aluminum.

20. A method of claim 17, wherein the second layers include titanium oxide.

21. A method of claim 20, wherein: the second layers are formed in a chamber using a first source gas for titanium and a second source gas for the element; and said forming of the second layers comprises a step of introducing only the second source gas into the chamber.

22. A method of claim 20, wherein:

the second layers are formed in a chamber using a first source gas for titanium and a second source gas for the element; and said forming of the second layers comprises introducing the first and second gases simultaneously into the chamber.

23. A method of claim 17, wherein the second layers include at least one material selected from a group consisting of calcium titanate, barium titanate, and strontium titanate.

24. A method of claim 23, wherein said forming of the second layer comprises sequentially introducing a first source gas for titanium, introducing a second source gas for oxygen, introducing a third source gas for the element, and introducing the second source gas for oxygen, in this order.

* * * * *